United States Patent [19]
Sedluk et al.

[11] Patent Number: 6,100,825
[45] Date of Patent: Aug. 8, 2000

[54] CLUSTER-BASED DATA COMPRESSION SYSTEM AND METHOD

[75] Inventors: Martin J. Sedluk, Redmond; John W. Miller, Kirkland, both of Wash.

[73] Assignee: Microsoft Corporation, Redmond, Wash.

[21] Appl. No.: 09/224,268

[22] Filed: Dec. 31, 1998

[51] Int. Cl.[7] .............................. H03M 7/34; H03M 7/30
[52] U.S. Cl. .............................................. 341/51; 341/87
[58] Field of Search ........................................ 341/51, 87

[56] References Cited

U.S. PATENT DOCUMENTS

| | | | |
|---|---|---|---|
| 4,028,731 | 6/1977 | Arps et al. | 341/51 |
| 4,494,108 | 1/1985 | Langdon, Jr. et al. | 341/51 |
| 5,635,931 | 6/1997 | Franaszek et al. | 341/51 |
| 6,018,303 | 1/2000 | Sadeh | 341/51 |

*Primary Examiner*—Trong Phan
*Attorney, Agent, or Firm*—Lyon, Harr & DeFrank; Edmond A. DeFrank; Craig S. Fischer

[57] ABSTRACT

The present invention is embodied in a method and system for compressing data using clustering techniques. The invention provides compression of a data ensemble composed of individual data sets. Each individual data set has associated data set context and history contexts. The present invention groups similar data set contexts and history contexts together so as to achieve a reduced total encoding cost. This total cost is minimized by selecting the clustering of the data set and history contexts such that the models or codebooks used to compress tokens are shared between tokens assigned to the same context clusters. Using clustering techniques, the present invention alternately varies the data set context clustering and history context clustering until a minimum total cost is achieved.

33 Claims, 7 Drawing Sheets

CLUSTER-BASED DATA COMPRESSION SYSTEM AND METHOD

BACKGROUND OF THE INVENTION

1. Field of the Invention

The present invention relates in general to data compression and more particularly to a method and system for compressing data using clustering techniques.

2. Background Art

Data compression is vitally important as demand increases for more rapid processing, access, storage and transmission of data. Data may include text, sounds, images and video. Improvements in data transmission and storage systems have come slower than the historical dramatic increase in processing power in computer systems. As a result, there has been a steadily increasing incentive to use additional processor resources to encode and decode data in a format which reduces the relative demand upon the storage and communications resources of computer systems and computer networks.

Data compression schemes that enable an exact reproduction of the initial input data are referred to as using lossless data compression. In lossless data compression, the primary goal is to change the representation of the data so that the more likely sequences of data from a source are represented using fewer bits of information. Since likely sequences of data are encoded with fewer bits, other sequences must necessarily be encoded with longer bit sequences. The best performance on average is achieved when the number of bits used to represent a sequence is proportional to the logarithm of the inverse of the probability of the sequence. The expected length of the bit sequence that gives this optimal compression can be calculated directly from the probability distribution and is typically referred to as the entropy of the distribution. If both the encoder and decoder are given information allowing them to calculate the probability of any sequence from a source, then there are existing techniques that can compress the sequence to within 1 bit of this entropy. For this reason, the problem of minimum size lossless data compression is equivalent to finding an accurate probabilistic model for a data source.

One approach to probabilistic modeling is to estimate the probability of each symbol in a sequence based upon the frequency of the same symbol given similar patterns of prior characters. These sets of "similar" patterns of prior characters will be referred to as contexts. One simple modeling scheme uses the prior character as a context and maintains a probability distribution for each possible prior character. Character based probabilistic models can generally be described by the method for choosing and possibly adapting the choice of contexts and the method for choosing and possibly adapting the estimated probability distribution for each context.

Compression systems frequently have a preliminary encoding followed by a secondary encoding. For example, the preliminary encoder of a Lempel-Ziv, 1977 (LZ-77) compression scheme takes a sequence of characters and replaces recurring groups of characters with a pair of tokens called the offset and the length. The offset represents the number of input characters since the previous occurrence of the identical grouping of characters. The length indicates the number of characters in the grouping of characters. A secondary encoding transforms the offset and length pairs into a variable-length sequence of bits such that the more frequently occurring offset and length pairs are represented by shorter bit sequences. Another example of a preliminary encoder is a Move-to-Front (MTF) encoder. A MTF encoder maintains an ordered list of all possible characters. For each input character the MTF encoder replaces the character with its position on the list. Further, after the encoder uses each character the character is moved to the front of the list. Therefore, more frequently occurring characters will tend to have lower position number on the list than less frequent characters.

Typically the tokens from the preliminary encoder are then converted to variable length bit sequences appropriate for the probability distribution of tokens. Both the encoder and decoder must maintain identical estimates for the distribution of tokens. Adaptive encoders achieve this consistency by updating the probability estimate of tokens as they are decoded. Non-adaptive encoders typically use a fixed distribution which is stored in a header which precedes the encoded tokens. When random access to small compressed records is required, the efficiency of the adaptive approach is reduced because a short sequence cannot be used to accurately estimate the probability distribution of tokens. Similarly, the efficiency of the non-adaptive approach using a header for each record is reduced because the overhead for representing the header must be amortized over fewer tokens in a shorter record. For this reason, efficient access to small records requires a system which effectively shares the modeling information used to decompress the multiple records.

SUMMARY OF THE INVENTION

To overcome the limitations in the prior art as described above and other limitations that will become apparent upon reading and understanding the present specification, the present invention is embodied in a method and a system for compressing data using clustering techniques to compress codebook or frequency modeling information. In addition, the data compression method and system of the present invention provides rapid and random access to individual data sets.

In particular, the present invention is especially well-suited for compressing a large number of small data sets in a way that allows each data set to be individually and quickly decompressed by a decoder. Moreover, the present invention can be used with several existing encoders so that existing decoders can be used with only slight modification. The invention includes a method for compressing a data ensemble having several data sets. Each data set has an associated label called the data set context. For each token in each data set there is a label associated with the pattern of recent tokens called the history context. Generally, the method includes grouping each of the data set contexts into data set context clusters. The clusters are created by determining which data set contexts are similar to each other, and can be accomplished with clustering techniques, such as re-allocation techniques. The method further includes grouping the history contexts of each data set context into a plurality of history context clusters by determining which history contexts are similar. A clustering technique can be used to determine the history context cluster assignments, such as a reciprocal nearest neighbor clustering (RNNC) technique.

These groupings of data set contexts and history contexts into their respective clusters are varied to minimize the total cost achieved. The total cost is the number of bits required to represent all of the data sets. More specifically, the total cost is the total encoding cost of the encoded tokens plus the overhead for representing the encoding format to be used for each document and history context. Because the total cost is dependent on the grouping of both the data set contexts and the history contexts into clusters, varying the grouping in the clusters will change the total cost. Thus, both cluster assignments are varied until no additionally reduced cost can be found. The present invention can be embodied in a computer-readable medium having several computer-executable modules for performing the functions described above.

Other aspects and advantages of the present invention as well as a more complete understanding thereof will become apparent from the following detailed description, taken in conjunction with the accompanying drawings, illustrating by way of example the principles of the invention. Moreover, it is intended that the scope of the invention be limited by the claims and not the preceding summary or the following detailed description.

BRIEF DESCRIPTION OF THE DRAWINGS

Referring now to the drawings in which like reference numbers represent corresponding parts throughout.

DETAILED DESCRIPTION OF THE PREFERRED EMBODIMENT

In the following detailed description of the preferred embodiment, reference is made to the accompanying drawings in which is shown by way of illustration a specific embodiment whereby the invention may be practiced. It is to be understood that other embodiments may be utilized and structural and functional changes may be made without departing from the scope of the present invention.
Exemplary Operating Environment FIG. 1 and the following discussion are intended to provide a brief, general description of a suitable computing environment in which the invention may be implemented. Although not required, the invention will be described in the general context of computer-executable instructions, such as program modules, being executed by a computer. Generally, program modules include routines, programs, objects, components, data structures, etc. that perform particular tasks or implement particular abstract data types. Moreover, those skilled in the art will appreciate that the invention may be practiced with a variety of computer system configurations, including personal computers, server computers, hand-held devices, multiprocessor systems, microprocessor-based or programmable consumer electronics, network PCs, minicomputers, mainframe computers, and the like. The invention may also be practiced in distributed computing environments where tasks are performed by remote processing devices that are linked through a communications network. In a distributed computing environment, program modules may be located on both local and remote computer storage media including memory storage devices.

Figure 1:
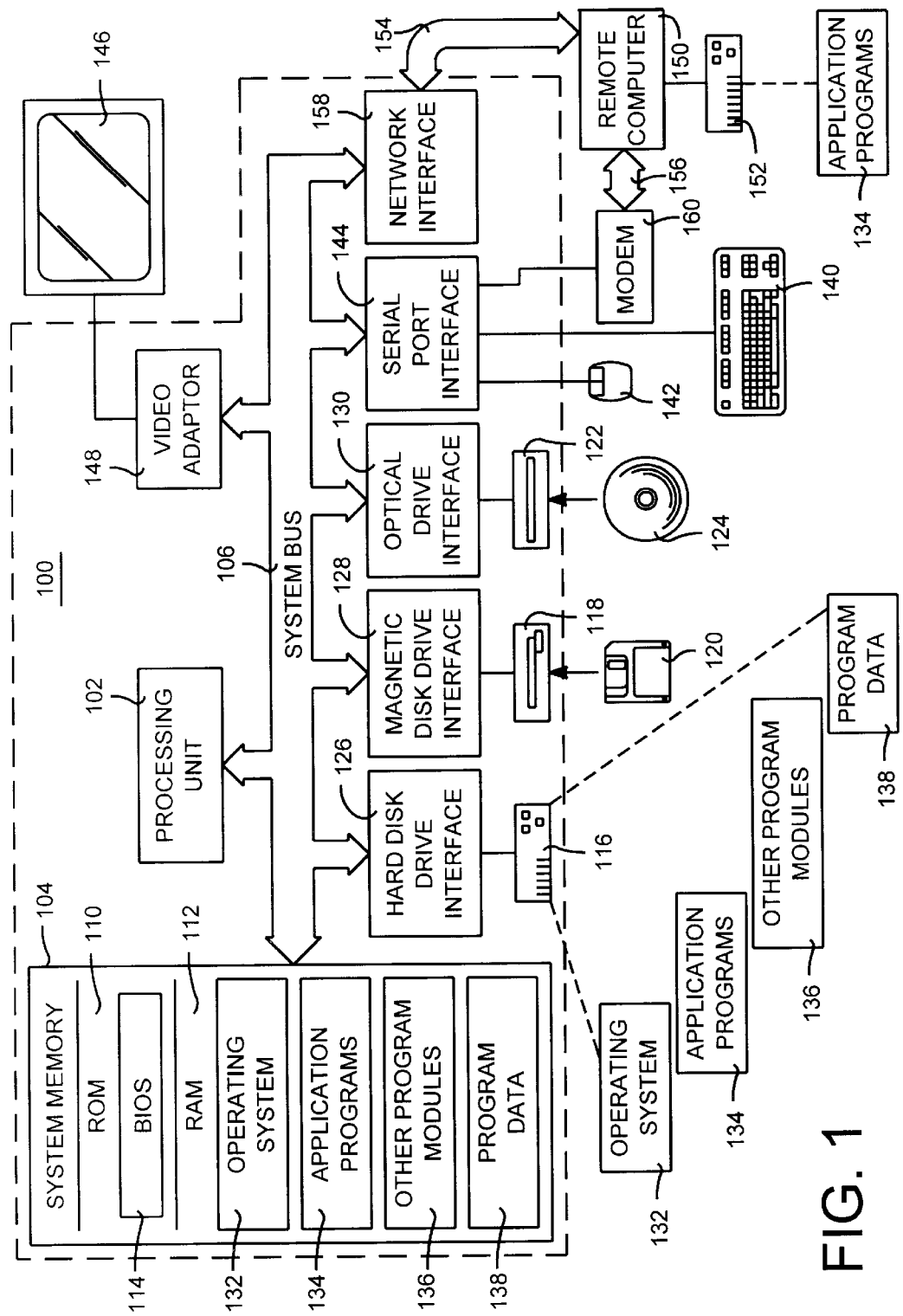
FIG. 1 is a block diagram illustrating an apparatus for carrying out the invention.

With reference to FIG. 1, an exemplary system for implementing the invention includes a general purpose computing device in the form of a conventional computer 100, including a processing unit 102, a system memory 104, and a system bus 106 that couples various system components including the system memory 104 to the processing unit 102. The system bus 106 may be any of several types of bus structures including a memory bus or memory controller, a peripheral bus, and a local bus using any of a variety of bus architectures. The system memory includes computer storage media in the form of read only memory (ROM) 110 and random access memory (RAM) 112. A basic input/output system 114 (BIOS), containing the basic routines that helps to transfer information between elements within computer 100, such as during start-up, is stored in ROM 110. The computer 100 may include a hard disk drive 116 for reading from and writing to a hard disk, not shown, a magnetic disk drive 118 for reading from or writing to a removable magnetic disk 120, and an optical disk drive 122 for reading from or writing to a removable optical disk 124 such as a CD ROM or other optical media. The hard disk drive 116, magnetic disk drive 128, and optical disk drive 122 are connected to the system bus 106 by a hard disk drive interface 126, a magnetic disk drive interface 128, and an optical drive interface 130, respectively. The drives and their associated computer-readable media provide storage of computer readable instructions, data structures, program modules and other data for the computer 100. Although the exemplary environment described herein employs a hard disk, a removable magnetic disk 120 and a removable optical disk 130, it should be appreciated by those skilled in the art that other types of computer readable media can store data that is accessible by a computer. Such computer readable media can be any available media that can be accessed by computer 100. By way of example, and not limitation, such computer readable media may comprise communication media and computer storage media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as wired network or direct wired connection, and wireless media such as acoustic, RF, infrared and other wireless media. By way of example, and not limitation, communication media includes wired media such as a wired network or direct wired connection, and wireless media such as acoustic, RF, infrared and other wireless media. Computer storage media includes any method or technology for the storage of information such as computer readable instructions, data structures, program modules or other data. By way of example, such storage media includes RAM, ROM, EPROM, flash memory or other memory technology, CD-ROM, digital video disks (DVD) or other optical disk storage, magnetic cassettes, magnetic tape, magnetic disk storage or other magnetic storage devices, or any other medium which can be used to store the desired information and which can be accessed by computer 100. Combinations of any of the above should also be included within the scope of computer readable media.

A number of program modules may be stored on the hard disk, magnetic disk 120, optical disk 124, ROM 110 or RAM 112, including an operating system 132, one or more application programs 134, other program modules 136, and program data 138. A user may enter commands and information into the computer 100 through input devices such as a keyboard 140 and a pointing device 142. Other input devices (not shown) may include a microphone, joystick, game pad, satellite dish, scanner, or the like. These and other input devices are often connected to the processing unit 102 through a serial port interface 144 that is coupled to the system bus 106, but may be connected by other interfaces, such as a parallel port, game port or a universal serial bus (USB). A monitor 146 or other type of display device is also connected to the system bus 106 via an interface, such as a video adapter 148. In addition to the monitor 146, computers may also include other peripheral output devices (not shown), such as speakers and printers.

The computer 100 may operate in a networked environment using logical connections to one or more remote computers, such as a remote computer 150. The remote computer 150 may be a personal computer, a server, a router, a network PC, a peer device or other common network node, and typically includes many or all of the elements described above relative to the personal computer 100, although only a memory storage device 152 has been illustrated in FIG. 1. The logical connections depicted in FIG. 1 include a local area network (LAN) 154 and a wide area network (WAN) 156. Such networking environments are commonplace in offices, enterprise-wide computer networks, intranets and the Internet.

When used in a LAN networking environment, the computer 100 is connected to the local network 154 through a network interface or adapter 158. When used in a WAN networking environment, the computer 100 typically includes a modem 160 or other means for establishing communications over the wide area network 156, such as the Internet. The modem 160, which may be internal or external, is connected to the system bus 106 via the serial port interface 144. In a networked environment, program modules depicted relative to the computer 100, or portions thereof, may be stored in the remote memory storage device. It will be appreciated that the network connections shown are exemplary and other means of establishing a communications link between the computers may be used.

I. Clustering Introduction

As shown in FIGS. 2–7 for purposes of illustration, the present invention is embodied in a method and a system for compressing data using clustering techniques. The system includes a clustering initialization module for initializing the input stream of data sets, a cluster improvement module for selecting a clustering and an evaluation module for determining an efficient clustering. Further, the present invention includes a method for compressing data by alternating between grouping data set contexts into data set context clusters and grouping encoding history contexts into encoding history context clusters. The efficiency of the two groupings is evaluated by determining the total encoding cost. The present invention searches for a combination of groupings of data set contexts into data set context clusters and encoding history contexts into encoding history contexts clusters that achieves the lowest total encoding cost.

The present invention allows rapid and random access to individual data sets and allows the sharing of context modeling parameters thereby providing highly efficient data compression. The present invention utilizes a clustering method for efficient data compression. The clustering method compresses a data ensemble made up of several individual data sets into a format useful for quick retrieval of individual data sets.

1. Clustering

Figure 2:
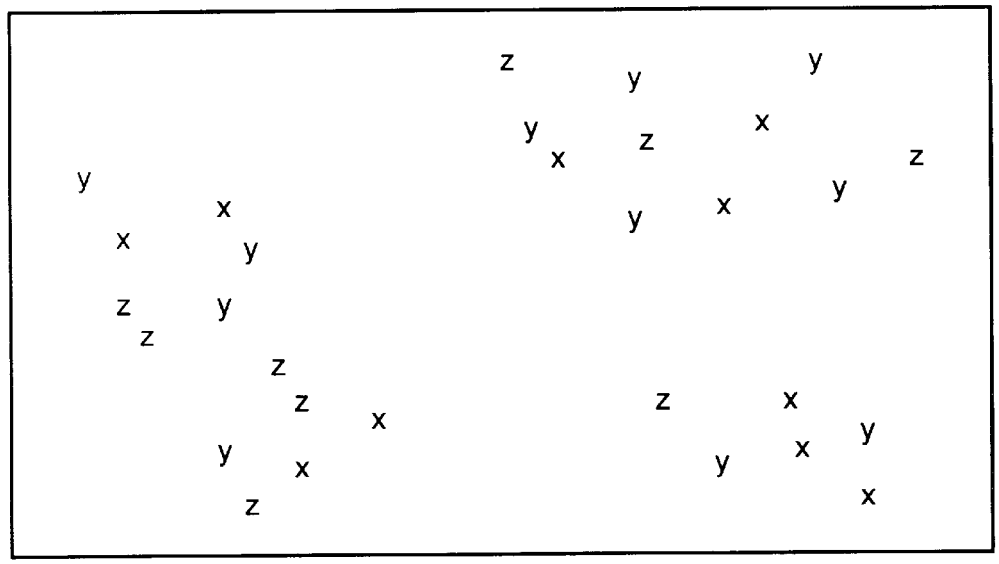
FIG. 2 illustrates a data set represented by varying criteria.
Figure 3:
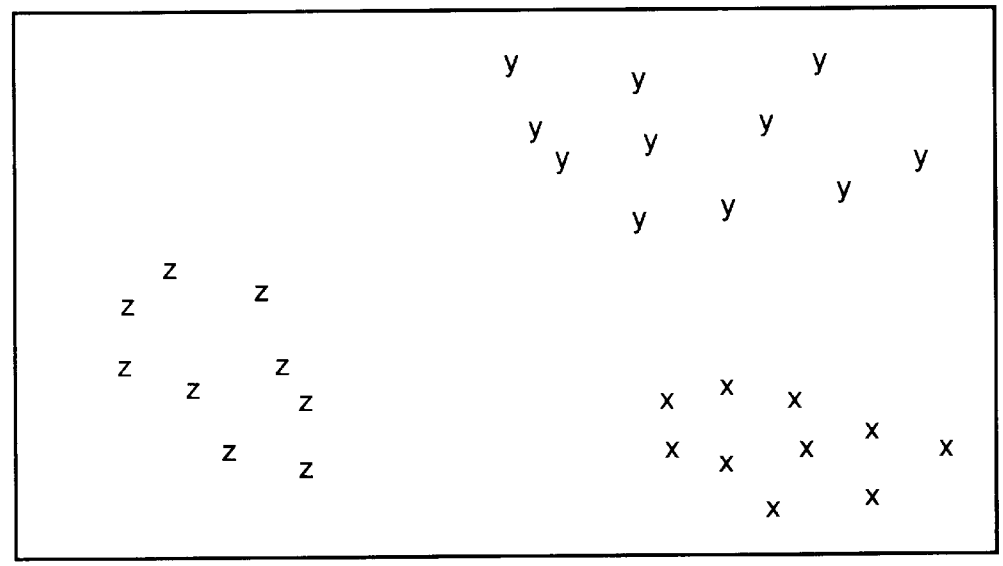
FIG. 3 illustrates a grouping example of the data set of FIG. 2 after clustering has been performed.

Clustering is the assignment of multiple labels to a set of data objects so that objects which are in some sense "near" to each other are given the same label. FIG. 2 illustrates a data ensemble of 30 points lying on a two dimensional plane. The initial labels "x", "y", and "z", were randomly assigned to the points. FIG. 3 illustrates a new assignment of labels such that each label corresponds to a cluster (a grouping) of nearby points. This example shows an assignment of 3 labels which maximizes the least distance between any two objects with different labels. This least-distance function is just one example of an evaluation function useful for comparing label assignments. An evaluation function is called a benefit function or a cost function depending upon if the objective is to maximize or minimize the function's evaluation of label assignments.

An example of a family of clustering techniques is re-allocation. In this approach an object is selected and re-labeled with whichever label produces the best evaluation. This is repeated until no improvement in the evaluation is possible by changing the label of a single object.

II. Structural Overview

Figure 4:
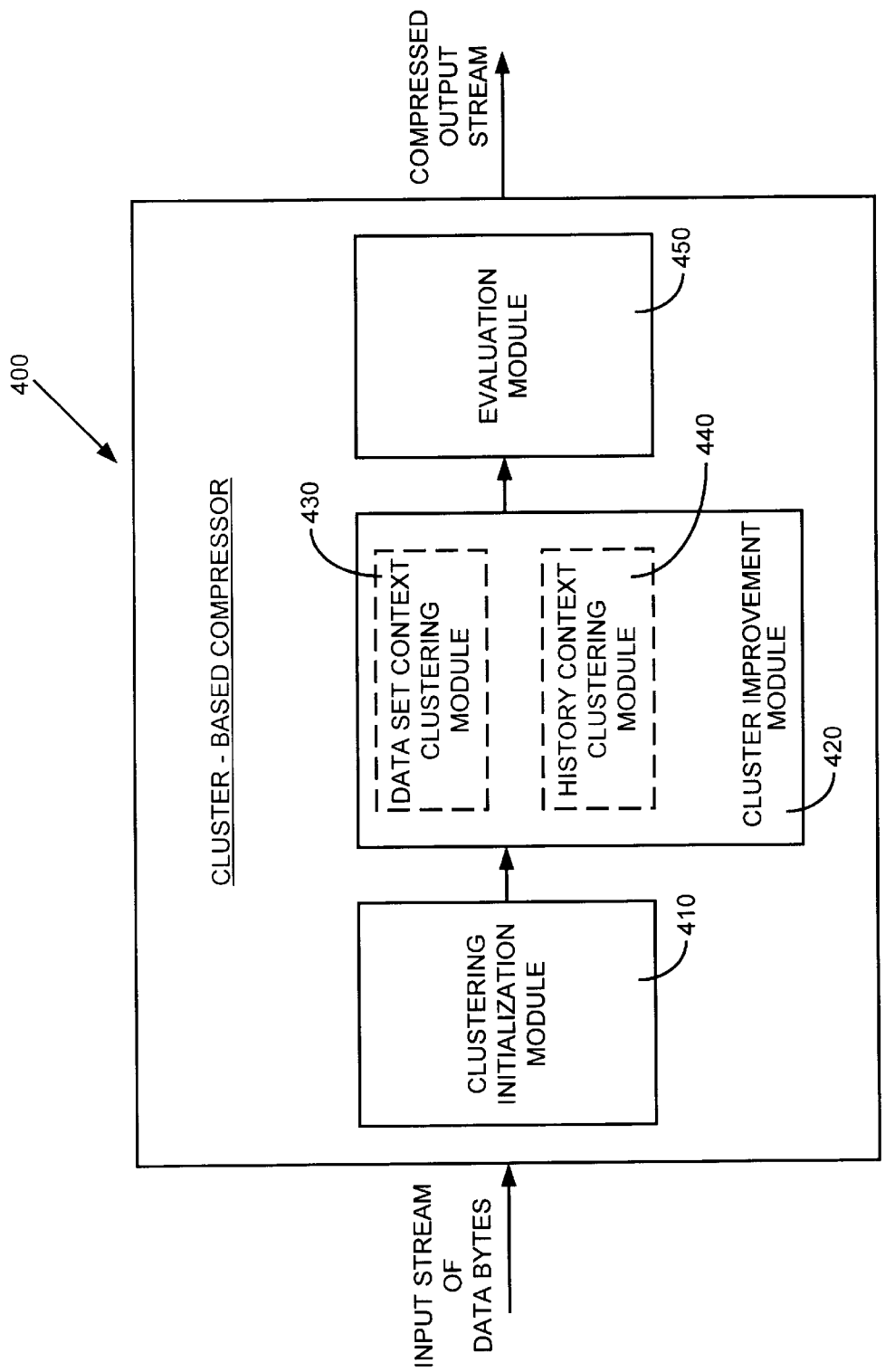
FIG. 4 is an overview structural block diagram of a data compression system according to the present invention.

FIG. 4 is an overview structural block diagram of the cluster-based data compression system 400 of the present invention. In general, the compression system 400 receives data sets in the form of a stream of data bytes and outputs a compressed stream. This input data stream is a data ensemble containing several individual data sets. For example, these data sets could be short records of any type, such as images, document titles, text, and the like. In addition, the data sets may have already been compressed by some type of preliminary encoders, such as the tokens produced by run-length encoding, LZ-77 encoding or MTF encoding. A clustering initialization module 410 receives the input stream and defines initial data set and history context clusters. The module 410 takes the input stream and parses the stream into individual data sets. Each data set is assigned an initial data set context cluster. In the preferred embodiment these labels are chosen randomly from a small set of labels, although other initialization strategies for clustering techniques are known to those skilled in the art. If appropriate for the data, preliminary encoding of each data set such as with LZ-77 encoding is done at this time. Each token within each data set is assigned an initial history context. In the preferred embodiment, the initial history context cluster for each token is a label indicating the prior token from the same data set. The module 400 then sends these initial clusters to a cluster improvement module 420 comprised of a data set context clustering module 430 and a history context clustering module 440.

The clustering improvement module 420 provides an improved clustering of data set and history contexts. The improvement module 420 decreases the overall encoding cost by changing the contents of each of the data set and history context clusters by grouping different data set and history contexts together into clusters. After the initial data set and history context clusters are received by the improvement module 420, they are processed by the data set context clustering module 430. The data set context clustering module 430 improves the assignment of data sets contexts into data set context clusters by using a pre-selected clustering technique, such as a reallocation clustering method, which is discussed further below.

Next, the history context clustering module 440 groups the tokens contexts of each data sets into history context clusters. Although suitable clustering technique may be used, a reciprocal nearest neighbor clustering technique is preferably used. As discussed further below, the history context clustering module 440 finds a reciprocal nearest neighbor and merges the two neighbors into a single history context cluster. The clustering improvement module 420 then sends the information from the data set context clustering module 430 and the history context clustering module 440 to an evaluation module 450.

The evaluation module 450 evaluates the cost of encoding the data ensemble given the current data set context clustering and the history context clustering. The best clustering of data set contexts is dependent upon the history context clustering, and vice versa. For this reason, the data set context clustering module and history context cluster modules are used in alternating sequence until the evaluation module 450 indicates a sequence in which no improvement had been found.

III. Functional Overview

Figure 5:
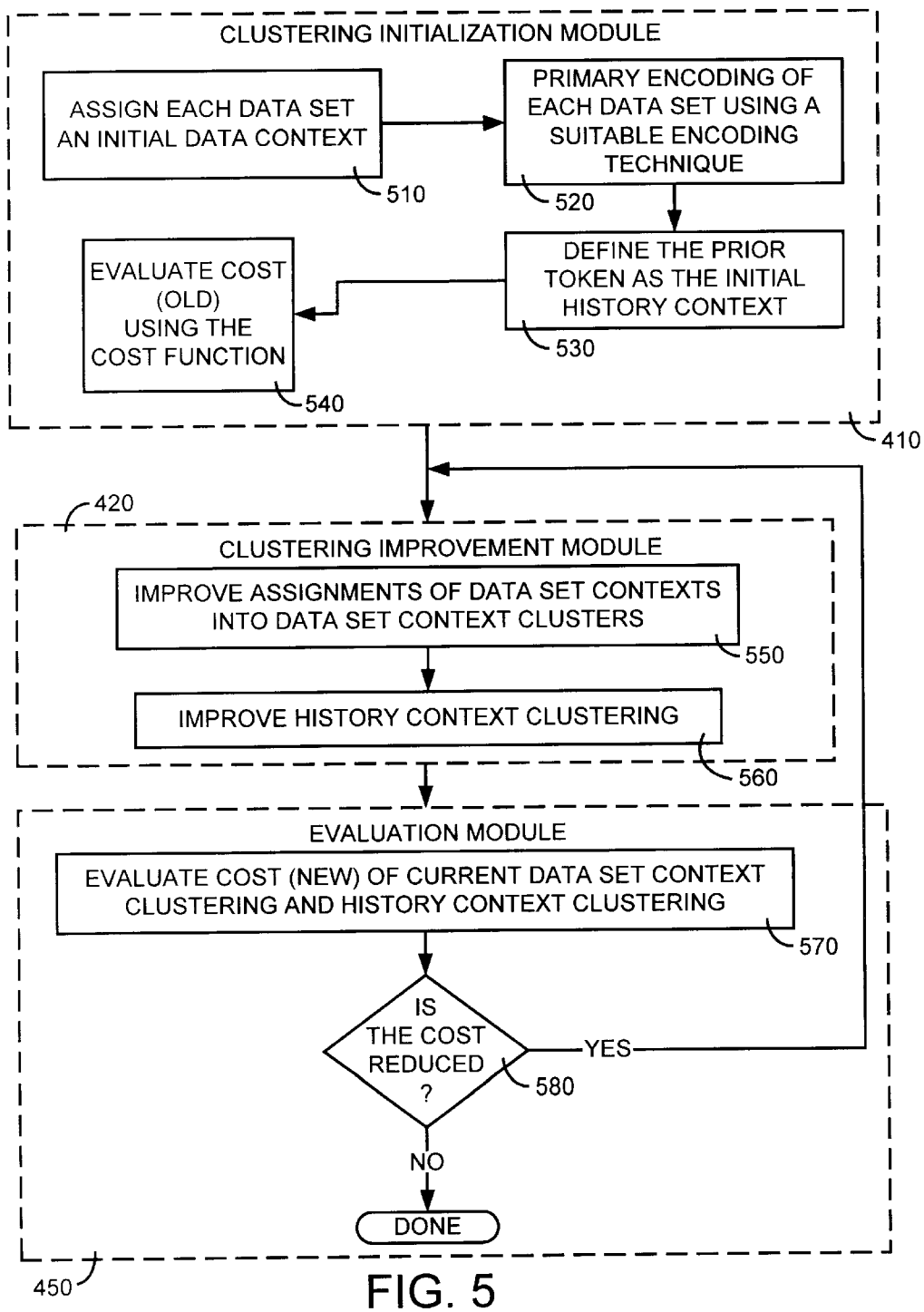
FIG. 5 is an overview flow diagram of the operation of the data compression system shown in FIG. 4.

FIG. 5 is an overview flow diagram of the operation of the data compression system 400 described above. The operation of each of the clustering initialization module 410, the clustering improvement module 420 and the evaluation module 450 will now be discussed.

1. Clustering Initialization Module

The clustering initialization module 410 receives a stream of data bytes from a data source and assigns an initial clustering of data sets and history contexts. Initially, the desired initial number of data set clusters is set. For example, 256 initial document clusters can be used. Each data set is assigned an initial data set context (box 510). Preferably, the data set context is a randomly selected integer chosen from, for example, a set of 256 different integers.

After this assignment, any initial changes of representation known to be effective for the source of data can be applied. This operation is delayed until the data set context is chosen so that the choice of representation could depend upon this cluster label. For example, with image data, half of the data set clusters could be represented by LZ-77 offset-length tokens, whereas the other half of the clusters could be rotated 90 degrees before being encoded into LZ-77 offset-length tokens (box 520).

Next, the prior token in the compressed data format is defined as the initial history context (box 530). The initial data set and history contexts are then used to create codebooks for every decoding context. In the preferred embodiment, the codebook is created using Huffman's technique which assigns each token a sequence of binary digits such that no sequence is the prefix of another. With Huffman's technique the lengths of the encoded sequences increase with decreasing frequency for the token. The codebooks are in effect a representation of the relative frequency of the set of tokens for a particular decoding context. Huffman's technique is optimal for the case where these relative frequencies must be approximated by powers of ½ so that each encoded token may be represented by an integer number of binary symbols. An alternative embodiment creates a codebook which represents the frequencies without restricting the relative frequencies to powers of ½. The technique for using this codebook using arithmetic compression is known to those skilled in the art. The cost of representing a sequence given a codebook for arithmetic or Huffman coding is known to those skilled in the art. This cost is added together for all decoding contexts and added to the number of bits required to represent all the codebooks to get a total cost. This total cost produced by the evaluation module 450 of FIG. 4 is identical to the number of bits which can be used to represent all the encoded data sets combined (box 540).

2. Clustering Improvement Module

The clustering improvement module 420 improves the data set and history context clustering to reduce the total cost and thereby improve compression efficiency. In the improvement module 420, alternating clustering between the data set context clustering module 550 and the history context clustering module 560 is preferably performed.

a. Data set Context Clustering Module

The data set context clustering module improves the assignment of data sets into data set context clusters. The data set context can be clustered using any suitable clustering technique, such as a reallocation method. Generally, this method works by selecting an item at each iteration and evaluating the change in cost for every possible movement of the item to a different cluster. In this particular application of the reallocation method, the items are documents. The cost is identical to the total cost calculated by the evaluation module 450 describe above. The clustering technique must repeatedly calculate costs for nearly identical cluster assignments. Therefore an optimization is used, obvious to one skilled in the art, to quickly calculate changes in the total cost from changes in the clusters, rather than recalculating components of the cost unaffected by an incremental change to the clusters.

Figure 6:
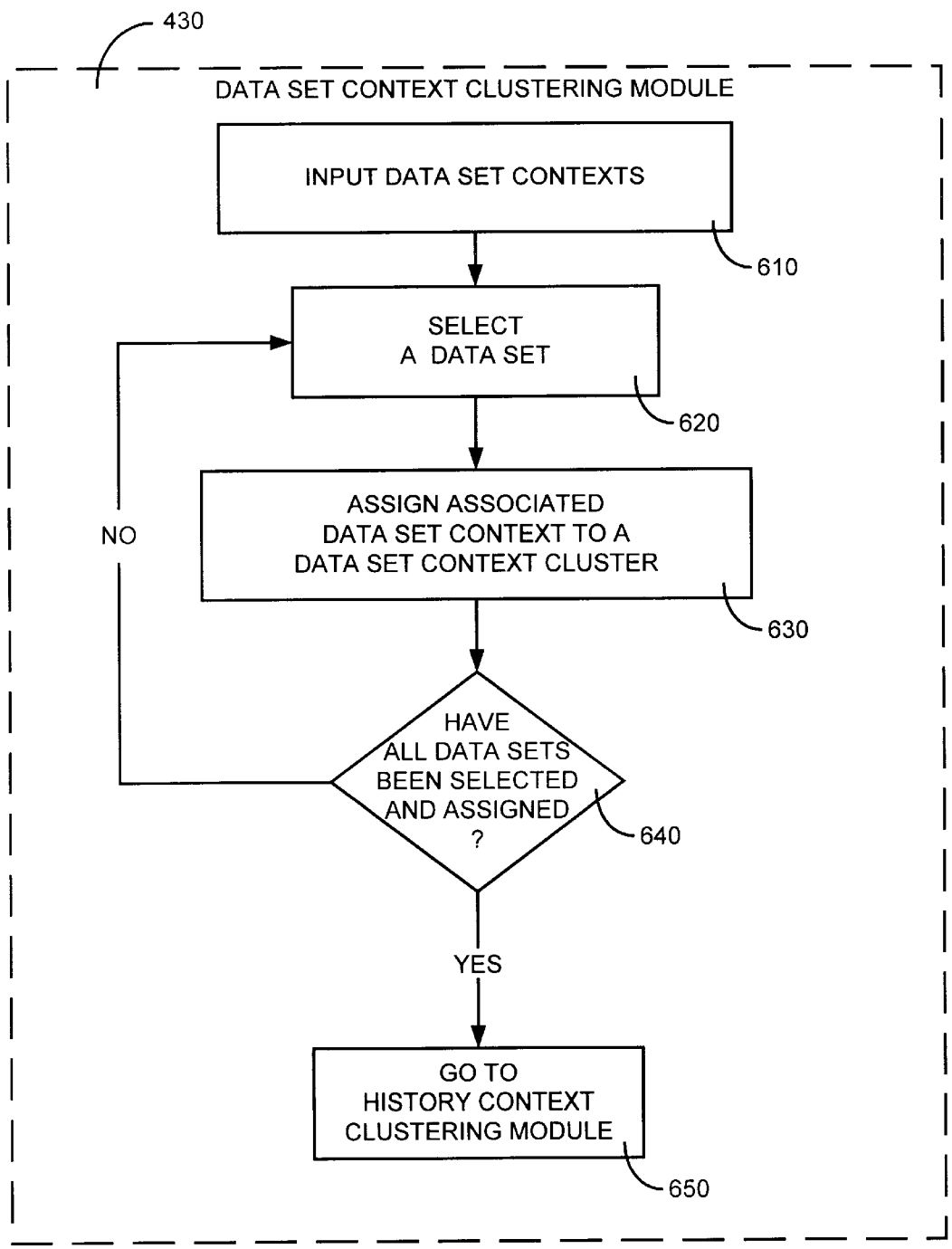
FIG. 6 is a detailed flow diagram of the operation of the data set contexts clustering module of FIGS. 4 and 5.

FIG. 6 is a detailed flow diagram of the operation of the data set contexts clustering module of FIGS. 4 and 5. Referring to FIG. 6 along with FIGS. 4 and 5, the initial data set contexts are input from the clustering initialization module 410. Next, a data set is selected for assignment (box 620), The data set is assigned to the data set context cluster which results in the lowest evaluated cost over all examined assignments for the particular data set (box 630). Next, it is determined whether all the data sets have been selected and all the associated data set contexts have been assigned (box 640). If not, then another iteration is performed by selecting another data set (box 620). Otherwise, the iteration is temporarily complete and operations begin with the history context clustering module 440.

b. History Context Clustering Module

The history context clustering module 440 groups the tokens contexts of each individual data set into history context clusters. The module 440 achieves this by using a suitable clustering technique, such as an agglomerative clustering technique. In agglomerative clustering, each group begins with a single item assigned to the group. At each step two groups are selected that are merged (agglomerated) into a single group. The particular choice of groups to merge comes from a more specific family of clustering techniques, such as reciprocal nearest neighbor clustering (RNNC).

Figure 7:
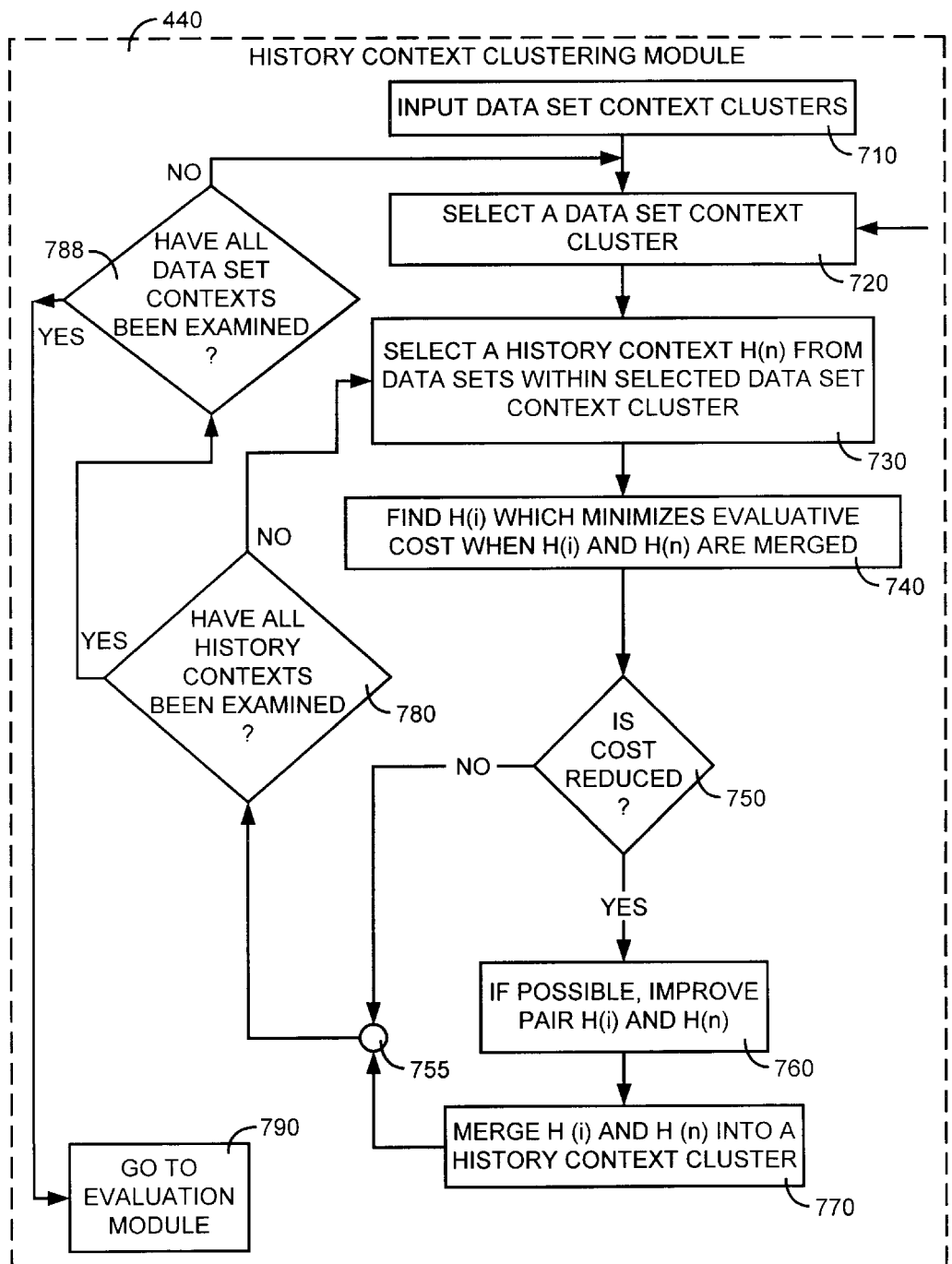
FIG. 7 is a detailed flow diagram of the operation of the encoding history contexts clustering module of FIGS. 4 and 5.

FIG. 7 is a detailed flow diagram of the operation of the encoding history contexts clustering module of FIGS. 4 and 5. Referring to FIG. 7 along with FIGS. 4 and 5, the history context clustering module 440 inputs the data set context clusters as determined previously by the data set context clustering module 430 (box 710). Next, a data set context cluster is selected for processing (box 720). The remainder of the operations within the history context clustering module 440 are performed until each data set context cluster has been processed. Following the selection (box 720), a history context H(n) is selected from data sets within the current selected data set context cluster (box 730). For each history context H(i), the change in the cost function which occurs if clusters H(i) and H(n) are merged (given the same label) is evaluated. For instance, the module 440 can find H(i) which minimizes evaluative cost when H(i) and H(n) are merged. If no merge reduces the cost (box 750), and if any history contexts have been unexamined (box 780) a new H(n) is again selected (box 730). If possible, improve pair H(i) and H(n) (box 760).

Specifically, if H(n1) and H(n2) can be merged to improve the cost, then H(n3) is set to be the context found which produces the minimum cost merge with cluster H(n2). If H(n1)==H(n3) then H(n1) and H(n2) are Reciprocal Nearest Neighbors (RNN) and H(n1) and (n2) are merged to produce an improved clustering of history contexts (box 770). If H(n1) is not equal to H(n3), then H(n1) is set to H(n2), H(n2) is set to H(n3), and the process repeats with another search which assigns H(n3) to be the context found which produces the minimum cost merge with cluster H(n2). When this process ends with an RNN pair H(n1) and H(n2), the pair are merged (box 770), and if any history contexts have been unexamined ( box 780), then a new H(n1) is selected (box 730). After all history contexts within a data set context cluster have been examined, the process repeats by choosing the next data set context cluster (box 720), until all data set contexts have been examined (box 788). After all data set contexts have been examined, operations pass to the evaluation module 790.

3. Evaluation Module

Referring back to FIG. 5, the evaluation module 450 evaluates the total cost given the current data set context clustering and the history context clustering. The cost function is used to evaluate the cost based on the current data set context and history context clustering as determined by the data set context clustering module 430 and the history context clustering module 440 (box 570). If the cost is reduced, operations are sent back to the cluster improvement module 420 to search for additional data set context and history context clustering improvements. From the foregoing it will be appreciated that the cluster-based data compression method and system according to the present invention offer numerous advantages. In particular, the clustering improvement module 400, including the data set context clustering module 430 and the history context clustering module 440, provide a novel way to achieve highly efficient compression of a various types of data. This is accomplished by determining an efficient clustering of data set contexts and history contexts for a given data ensemble. Further, this data ensemble is composed of several individual data sets and the present invention achieves rapid and random access to individual data sets contained within the data ensemble. This permits an individual data set to be found quickly and decoded rapidly. The present invention also increases the compression performance and is compatible with many types of existing data compression techniques. Thus, the present invention provides a novel and efficient system and method of data compression using clustering techniques.

III. Decompression

Figure 8:
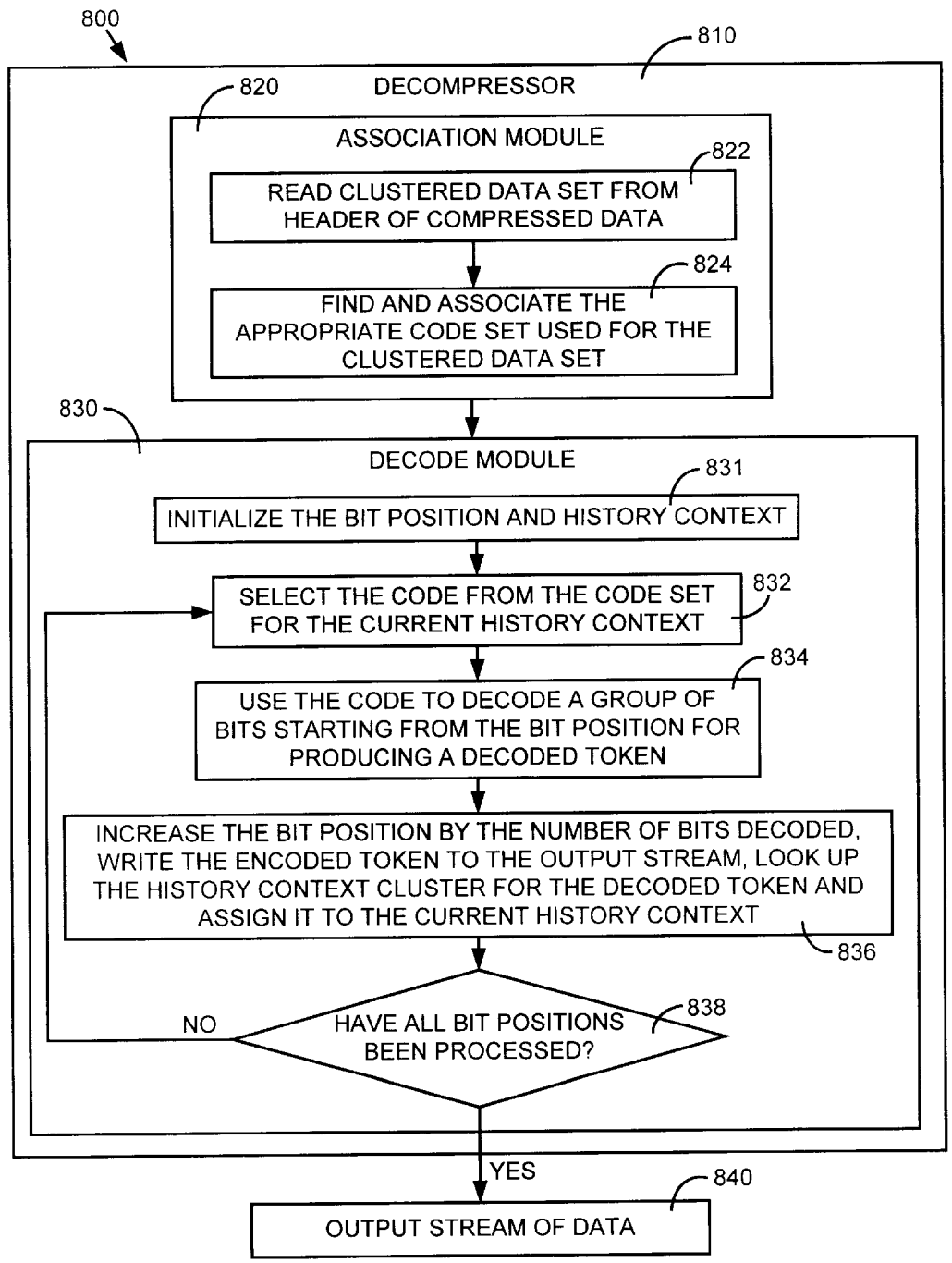
FIG. 8 is a flow diagram illustrating decompression of the compressed data.

When the original data needs to be recovered, the compressed data can be decompressed in accordance with the present invention. Any suitable decompression scheme that can produce an output data stream that substantially matches the original input data stream can be used. FIG. 8 is a block-flow diagram illustrating a sample decompression system 800 for producing the original input data from the compressed data. In general, a decompressor 810 receives the compressed data, an association module 820 associates the compressed data with the clustering scheme and set of codes used to compress the data, and a decode module 830 reconstructs the tokens by using the set of codes to decode the compressed data.

Specifically, the association module 820 reads the clustered data set from the header of the compressed data (box 822). For example, if 256 initial document clusters are used and each data set is assigned an initial data set context, the document cluster is read from the first 8 bits of the compressed document. The association module 820 then finds and associates the appropriate code set used for the clustered data set (box 824).

Next, the decode module 830 first initializes the bit position and history context (box 831) and selects the code from the code set for the current history context (box 832). The code is then used to decode a group of bits starting from an initial bit position for producing a decoded token (box 834). The bit position is increased by the number of bits decoded, the encoded token is written to the output stream, the history context cluster is looked up for the decoded token and assigned to the current history context (box 836). The decode module 830 repeats these steps until all bit positions have been processed (box 838). As a result, the decompression system 800 produces an output stream of data 840 representing the preliminary encoding of the input stream produced in box 520 of FIG. 5. If any preliminary encoder was used (such as offset-length encoding), this transformation is reversed to produce an output stream that substantially matches the input stream of data originally received by the cluster-based compressor 300 of FIG. 3.

The foregoing description of the preferred embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for compressing a plurality of data sets, each data set having a data set context and a history context, the compression method comprising:

grouping a plurality of data set contexts into a plurality of data set context clusters;

grouping a plurality of history contexts into a plurality of history context clusters;

varying the groupings within the data set context clusters and the history context clusters until a minimum total cost is achieved.

2. The invention as set forth in claim 1, wherein:

grouping a plurality of data set contexts further comprises assigning each data set context from a respective data set to a data set context cluster.

3. The invention as set forth in claim 2, wherein:

assigning each data set context further comprises using a clustering technique to determine the assignments.

4. The invention as set forth in claim 3, wherein the clustering technique is the Re-allocation Method.

5. The invention as set forth in claim 1, wherein:

grouping a plurality of history contexts further comprises using a clustering technique to determine the assignments.

6. The invention as set forth in claim 5, wherein the clustering technique is the Reciprocal Nearest Neighbor Clustering.

7. The invention as set forth in claim 1, wherein the minimum total cost is a number of bits required to represent each data set.

8. The invention as set forth in claim 7, wherein the total cost is a total encoding cost of each decoding context associated with each data set plus the cost of representing codebooks for each of decoding context.

9. A computer-readable medium having computer-executable modules, comprising:
- a data set context clustering module for grouping a plurality of data set contexts into a plurality of data set context clusters;
- a history context clustering module for grouping a plurality of history contexts into a plurality of history context clusters; and
- an evaluation module for varying the groupings within the data set context clusters and the history context clusters in order to minimize the achieved total cost.

10. The invention as set forth in claim 9, wherein:
grouping a plurality of data set contexts further comprises assigning each data set context from a respective data set to a data set context cluster.

11. The invention as set forth in claim 10, wherein:
assigning each data set context further comprises using a clustering technique to determine the assignments.

12. The invention as set forth in claim 11, wherein the clustering technique is the Reallocation Method.

13. The invention as set forth in claim 9, wherein:
grouping a plurality of history contexts further comprises using a clustering technique to determine the assignments.

14. The invention as set forth in claim 13, wherein the clustering technique is the Reciprocal Nearest Neighbor Clustering.

15. The invention as set forth in claim 9, wherein the minimum total cost is a number of bits required to represent each data set.

16. The invention as set forth in claim 15, wherein the total cost is a total encoding cost of each decoding context associated with each data set plus the cost of representing codebooks for each of decoding context.

17. A data compression system for compressing a plurality of data sets, comprising:
- a data set context clustering module that groups a plurality of data set contexts into a data set context cluster;
- a history context clustering module that groups a plurality of history contexts into a history context cluster; and
- an evaluation module that is used to vary the groupings within the data set context cluster and the history context cluster for minimizing the total cost found.

18. The invention as set forth in claim 1, wherein:
the data set context clustering module further comprises assigning each data set context from a respective data set to a data set context cluster.

19. The invention as set forth in claim 18, wherein:
assigning each data set context further comprises using a clustering technique to determine the assignments.

20. The invention as set forth in claim 19, wherein the clustering technique is the Reallocation Method.

21. The invention as set forth in claim 17, wherein:
the history context clustering module further comprises using a clustering technique to determine the assignments.

22. The invention as set forth in claim 21, wherein the clustering technique is the Reciprocal Nearest Neighbor Clustering.

23. The invention as set forth in claim 17, wherein the minimum total cost is a number of bits required to represent each data set.

24. The invention as set forth in claim 23, wherein the total cost is a total encoding cost of each decoding context associated with each data set plus the cost of representing codebooks for each of decoding context.

25. A compression method for compressing a plurality of data sets, each of the data sets containing a history context and a data set context, the method comprising:
- clustering similar history contexts from a data set to form a history context cluster; and
- clustering similar data set contexts into a data set context cluster which share the same history contexts clusters.

26. The invention as set forth in claim 25, wherein:
clustering similar history contexts further comprises using a clustering technique to determine which history contexts are similar.

27. The invention as set forth in claim 26, wherein the clustering technique is the Reciprocal Nearest Neighbor Clustering.

28. The invention as set forth in claim 25, wherein:
clustering similar data set contexts further comprises assigning each data set context from a respective data set to a data set context cluster.

29. The invention as set forth in claim 28, wherein:
assigning each data set context further comprises using a clustering technique to determine the assignments.

30. The invention as set forth in claim 29, wherein the clustering technique is a Re-allocation Method.

31. The invention as set forth in claim 25, further comprising:
varying the contents of each of the data set context cluster and the history context cluster so as to achieve a minimum total cost.

32. The invention as set forth in claim 31, wherein the minimum total cost is a least number of bits required to represent each data set.

33. The invention as set forth in claim 32, wherein the total cost is a total encoding cost of each decoding context associated with each data set plus the cost of representing codebooks for each of decoding context.

* * * * *